(12) United States Patent
Wong

(10) Patent No.: US 11,546,984 B1
(45) Date of Patent: Jan. 3, 2023

(54) ARCHITECTURE FOR CHIP-TO-CHIP INTERCONNECTION IN SEMICONDUCTORS

(71) Applicant: Cloud Light Technology Limited, Hong Kong (HK)

(72) Inventor: Ka Kit Wong, Hong Kong (HK)

(73) Assignee: Cloud Light Technology Limited, Hong Kong (HK)

( * ) Notice: Subject to any disclaimer, the term of this patent is extended or adjusted under 35 U.S.C. 154(b) by 0 days.

(21) Appl. No.: 17/530,449

(22) Filed: Nov. 18, 2021

(51) Int. Cl.
*H05K 1/18* (2006.01)
*H05K 3/30* (2006.01)
*H05K 1/02* (2006.01)
*H01L 23/66* (2006.01)

(52) U.S. Cl.
CPC ............ *H05K 1/024* (2013.01); *H01L 23/66* (2013.01); *H05K 1/0245* (2013.01); *H05K 1/181* (2013.01); *H05K 3/303* (2013.01); *H01L 2223/6627* (2013.01); *H01L 2223/6672* (2013.01); *H05K 2201/0723* (2013.01); *H05K 2203/107* (2013.01)

(58) Field of Classification Search
CPC ........ H05K 1/024; H05K 1/181; H05K 3/303; H05K 3/305
See application file for complete search history.

(56) References Cited

U.S. PATENT DOCUMENTS

| 10,008,797 B2 * | 6/2018 | Hassan-Ali ............ H05K 1/118 |
| 2010/0112833 A1 * | 5/2010 | Jeon ........................ H05K 1/142 |
| | | 439/78 |

* cited by examiner

*Primary Examiner* — Jeremy C Norris

(57) ABSTRACT

A PCB bridge for interconnection of two or more semiconductor chips for data communication between the semiconductor chips includes a plurality of metal strips; and a dielectric material disposed in between the plurality of metal strips. The PCB bridge is employed in a vertical direction in a semiconductor module for interconnection of two or more semiconductor chips, the vertical direction of the PCB bridge provides a flexible impedance matching by adjusting the dielectric material and a trace width of the PCB bridge, and the vertical direction of the PCB bridge avoids signal reflections by matching the impedance to a source, and a trace length of the PCB bridge is limited by spacing in between two semiconductor chips which further limited inductance of the trace of the PCB bridge.

20 Claims, 19 Drawing Sheets

1000B

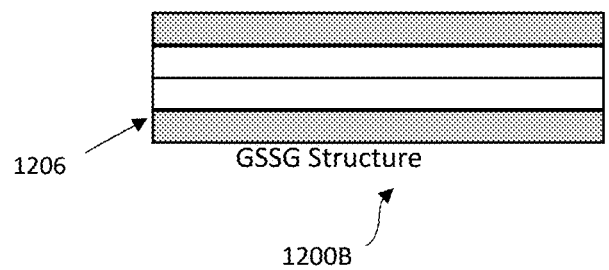
FIG. 15B
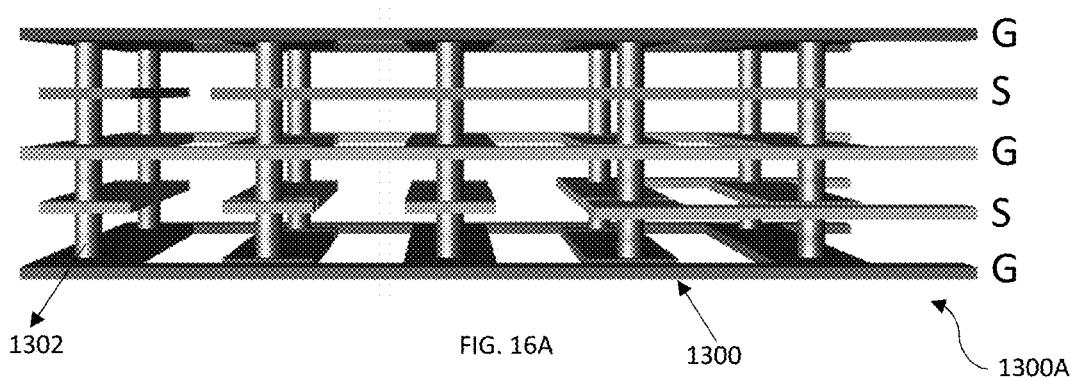
FIG. 16A
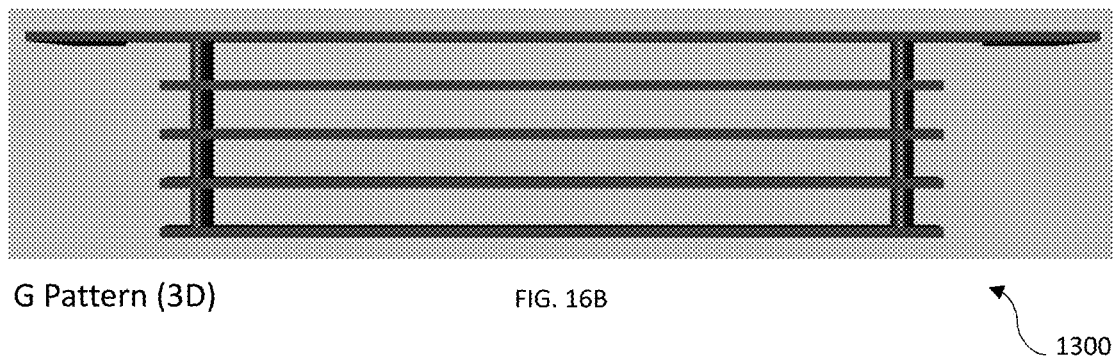
G Pattern (3D)    FIG. 16B
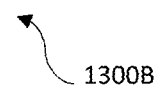

S Pattern (3D)

1300C

Trace spacing

1304

1300D

ARCHITECTURE FOR CHIP-TO-CHIP INTERCONNECTION IN SEMICONDUCTORS

FIELD

The present invention is generally related to semiconductor devices. More particularly, the present invention relates to chip-to-chip interconnection between different semiconductor chips.

BACKGROUND OF INVENTION

A chip-to-chip interconnection is a functional block that provides data communication between two different semiconductor chips that are assembled into one module. The interconnection can either be required in a PCB, PCB substrate, IC, Photonic IC and other components that require data communication interconnection. The chip-to-chip interconnection create the connection between two chips to achieve maximum power transfer and ultra-high bandwidth transmission. The chip-to-chip interconnection is typically made of different control block that provides a seamless connection between connection pads on two chips. This implemented using a high-speed architecture or high-density parallel architecture, which are optimized to support multiple advanced 2D, 2.5D, and 3D packaging technologies A chip-to-chip interconnection is a key structure of the industry trend in both monolithic SoC designs and multi-chip SoC design. This approach mitigates growing concerns around high cost/low yield of small process nodes and provides additional product modularity and flexibility.

To make a good chip-to-chip interconnection, the transmission line required to achieve maximum power transfer and ultra-high bandwidth. The transmission line can be modeled by the generalized lumped elements. The generalized lumped-element model of a transmission line can be used to calculate characteristic impedance, phase velocity, and both parts of the propagation constant (phase and attenuation). The model uses an infinitesimally small section of a transmission line with four elements as shown in FIG. 21. Here the series resistance, series inductance, shunt conductance and shunt capacitance are all normalized per unit length (denoted by the "prime" notation).

L=series inductance per unit length, in H/m, represents the total self-inductance of the conductors.

C=shunt capacitance per unit length, in F/m. represents the capacitance due to close proximity of the conductors.

R=series resistance per unit length, in $\Omega$/m, represents the resistivity loss due to finite conductivity of conductors.

G=shunt conductance per unit length, in S/m. represents the dielectric loss in the material.

For a lossless transmission line, the series resistance and shunt conductance can be ignored. The model can be simplified to a LC connection. The LC connection formed a LC low pass filter which cut off the high frequency signal and limited the transmission bandwidth. At the same time impedance matching is needed in the LC connection in order to minimize signal reflection or maximize power transfer. In DC circuits, the source and load should be equal. In AC circuits, the source should either equal the load or the complex conjugate of the load, depending on the goal.

These two issues dominated the communication performance of the interconnection.

PCBs typically use two types of transmission lines: microstrips and striplines. Each of the transmission lines consists of a signal trace and a reference plane(s). Based on the transmission line geometry, it is essential to assume the signal trace and the reference plane as one unit. And never divide them since microstrips and striplines have their unique EM field distributions which define their properties. The EM field distribution of the microstrip and stripline transmission lines can be changed by selecting the PCB material (dielectric constant and loss tangent) and adjusting the guided wavelength, propagation velocity, and characteristic impedance. These parameters eventually change the EM field distribution, therefore the properties of the transmission lines.

In current packaging technologies, wire bonding is one of the most common method to make the interconnection between two chips. Au or Cu wire are the most common bonding wire that attached on the wire bond pad by using ultrasonic or thermosonic energy. This makes a good adhesion and form an ohmic contact between the bond wire and the bond pad. However, since the dielectric between the bond wire is air and wire to wire distance are fixed, that means the capacitance between two bond wires are normally fixed. It limited the signal bandwidth, and it is difficult to make a good impedance matching between the source and the load. In general, wire bonding technologies provide a high flexibility of interconnection, but it suffers from worse impedance matching. Additionally, the wire diameter is limited by the size of the bonding pad in the wire bonding solutions. Furthermore, to construct different architectures, such as step different or for tilting bonding between two chips, a bit longer wire for tilting bonding between two chips is to be used in the assembly process.

In the advanced technologies that required high standard specification, silicon bridge will be used for building the interconnection. In the silicon bridge design, the dielectric is normally fixed as SiO2 which means fixed dielectric constant. A carefully design of trace width is needed to get a good impedance matching trace. Flip-chip bonding process is required for the silicon bridge bonding process which means a very tight thickness requirement is needed between two chips. In general, silicon bridge interconnection provides a good impedance matching interconnection, but it suffers from tight flip-chip bonding process. Trace width is limited by the pitch of bonding pad in silicon bridge.

Additionally, the silicon bridge is a rectangular shape due to the fabrication process. Therefore the flip chip process require very tight height requirement. The bonding may get open if there is step different between two chips.

In the above two mentioned method, both are also suffering from yield loss issue. It is because these two methods are not favorable for rework. The bonding pad has easily been damaged by the wire bonding or the flip-chip process.

Thus, there is a need of an interconnection between two chips that provides a flexibility for the impedance matching requirement, and avoids yield loss issue.

OBJECTIVE OF THE INVENTION

It is an objective of the present invention to build an interconnection between two semiconductor chips that provides a flexibility for the impedance matching requirement.

It is an objective of the present invention to build an interconnection between two semiconductor chips that has no limitation for the trace width selection.

It is an objective of the present invention to build an interconnection between two semiconductor chips that is favourable for non-destructive rework process.

It is also an objective of the present invention to handle different architectures in the assembly processes, such as stepping and tilting issue between two chips.

Another objective of the present invention is to provide a similar impedance matching performance while having a lower packaging requirement than silicon bridge.

Yet another objective of the present invention is to build an interconnection between two semiconductor chips that is low cost, has good impedance matching, and is reworkable and flexible.

To further clarify the advantages and features of the present invention, a more elaborate description of the invention will be rendered by reference to specific embodiments thereof, which is illustrated in the appended drawings. It is appreciated that these drawings depict only typical embodiments of the invention and are therefore not to be considered limiting of its scope.

SUMMARY OF THE INVENTION

An aspect of the present invention provides a PCB bridge for interconnection of two or more semiconductor chips for data communication between the semiconductor chips, comprising: a plurality of metal strips, where each metal strip is aligned one after the other, and each metal strip has two legs or connectors to contact and connect with connection pads on semiconductor chips, and wherein shape and size of the two legs or connectors of the each metal strip is cutout, using a cutting technique, to be either same or different from each other; and a dielectric material disposed in between the plurality of metal strips, wherein, the PCB bridge is employed in a vertical direction in a semiconductor module for interconnection of two or more semiconductor chips, wherein the vertical direction of the PCB bridge provides a flexible impedance matching by adjusting the dielectric material and a trace width of the PCB bridge, and wherein the vertical direction of the PCB bridge avoids signal reflections by matching the impedance to a source, and wherein a trace length of the PCB bridge is limited by spacing in between two semiconductor chips which further limited inductance of the trace of the PCB bridge.

An embodiment of the present invention provides the plurality of metal strips is made of copper, and the dielectric material is prepreg, and the vertical arrangement of the PCB bridge provides unlimited trace width that further raises flexibility of the impedance matching.

An embodiment of the present invention provides the dielectric material has a dielectric constant ranging from 2-5.

Another embodiment of the present invention provides the PCB bridge is manufactured using laser cut techniques to cutout the legs or connectors of the metal strips to provide them either regular or irregular shapes and sizes by changing a laser cut pattern.

An embodiment of the present invention provides the PCB bridge with flexible shapes and sizes of the legs or connectors of the metal strips compensates for a step different issue in a semiconductor module by forming one leg or connector of the metal strip longer than other leg or connector of the metal strip.

Yet another embodiment of the present invention provides the PCB bridge with flexible shapes and sizes of the legs or connectors of the metal strips compensates for a tilting issue in a semiconductor module by tilting a PCB panel while doing the laser cut pattern during the laser cut techniques.

An embodiment of the present invention provides the PCB bridge is manufactured as a fully shielded strip line PCB bridge structure, wherein the fully shielded strip line PCB bridge structure further includes one or more metal deposition layers at a top and a bottom of fully shielded strip line PCB bridge structure in addition to the plurality of metal strips and the dielectric material disposed in between the plurality of metal strips; and wherein the fully shielded strip line PCB bridge structure forms electromagnetic field barriers as it is shielded by the top and bottom metal deposition layers and the inbetween filling of the dielectric material, the fully shielded strip line PCB bridge structure blocking noise interference from space.

An embodiment of the present invention provides the PCB bridge is manufactured as a strip line PCB bridge structure with an external component on top, wherein the strip line PCB bridge structure with an external component on top further includes an external component on top of the PCB bridge in addition to the plurality of metal strips and the dielectric material disposed in between the plurality of metal strips, and wherein the external component is at least one of an inductor, a capacitor, a resistor or a ferrite bead.

Another embodiment of the present invention provides the PCB bridge is manufactured as a strip line fanout type PCB bridge structure, wherein the strip line fanout type PCB bridge structure further includes a conductive material in between the plurality of metal strips that connects each two metal strips of the plurality of metal strips in addition to the plurality of metal strips and the dielectric material disposed in between the plurality of metal strips; and wherein the strip line fanout type PCB bridge structure has two pitches, one pitch 'P' and the other is twice the pitch 'P'.

Another embodiment of the present invention provides the PCB bridge is manufactured as a strip line fanout type PCB bridge structure with embedded single layer capacitor, wherein the strip line fanout type PCB bridge structure with embedded single layer capacitor further includes a conductive material in between the plurality of metal strips that connects each two metal strips of the plurality of metal strips; and a single layer capacitor embedded in between two metal strips, in addition to the plurality of metal strips and the dielectric material disposed in between the plurality of metal strips.

Yet another embodiment of the present invention provides the PCB bridge is manufactured as a strip line fanout type PCB bridge structure with embedded multi-layer capacitor, as ground layer, wherein the strip line fanout type PCB bridge structure with embedded multi-layer capacitor further includes a conductive material that connects all of the plurality of the metal strips together at their end, in addition to the plurality of metal strips and the dielectric material disposed in between the plurality of metal strips.

Another embodiment of the present invention provides the PCB bridge is manufactured as a strip line fanout type PCB bridge structure with embedded multi-layer capacitor, as signal layer, wherein the strip line fanout type PCB bridge structure with embedded multi-layer capacitor further includes a conductive material that connects alternate metal strips at their end in the plurality of the metal strips, in addition to the plurality of metal strips and the dielectric material disposed in between the plurality of metal strips.

An embodiment of the present invention provides the PCB bridge interconnects more than two semiconductor chips in a 3D arrangement also, other than a 2D arrangement, in a single semiconductor module, wherein the plurality of the metal strips in the PCB bridge, in the 3D arrangement, includes a pair of metal strips, where the pair of metal strips is aligned one after the other, and each metal strip in the pair of the metal strips is stacked over another, and each metal strip in the pair of the metal strips has two legs or connectors to contact and connect with the semiconductor chips in the 3D arrangement; and wherein the 3D arrangement is a 3D stacking structure that includes the PCB bridge interconnecting at least four semiconductor chips, where two of the four semiconductor chips are stacked on one another, and other two are stacked on one another, and wherein the stacked two semiconductor chips is then interconnected with the stacked other two semiconductor chips, via the stacked and aligned pairs of the metal strips in the in the PCB bridge in the vertical direction of the PCB bridge.

Another embodiment of the present invention provides at least two such PCB bridges are stacked together and form an independent crossing connection, to form a 3D crossing structure that is used to connect two different signals, the 3D crossing structure being suitable to use in the space limited design with two independent connections.

An embodiment of the present invention provides at least two such PCB bridges interconnect more than two semiconductor chips in a 3D fanout crossing structure also, other than a 2D arrangement, in a single semiconductor module, wherein the 3D fanout crossing structure includes at least two PCB bridges and is used to fanout a chip signal into three ways, wherein the at least two PCB bridges are stacked together to form a fanout crossing connection, the at least two PCB bridges interconnects at least four semiconductor chips, where at least two of the four semiconductor chips are facing opposite to each other, and other two are facing opposite to each other forming a fanout structure, and wherein the metal strips and/or the legs or connectors of one of the at least two PCB bridges connects with at least one of the four semiconductor chips via connection nodes, and wherein the at least two PCB bridges are in vertical direction to interconnect the at least four semiconductor chips.

An aspect of the present invention provides a method of manufacturing a PCB bridge for interconnection of two or more semiconductor chips for data communication between the semiconductor chips, comprising: fixing a PCB panel at one or more panel fixtures at corners of a PCB; drawing laser cut lines to mark a plurality of metal strips for the PCB bridge, where each metal strip has two legs or connectors to contact and connect with connection pads on semiconductor chips, and wherein shape and size of the two legs or connectors of the each metal strip is drawn to be either same or different from each other to address semiconductor assembly issues including a step different issue and a tilting issue; laser cutting out along the drawn laser cut lines to manufacture the plurality of metal strips for the PCB bridge; aligning the cutout plurality of metal strips one after the other; and disposing a dielectric material in between the plurality of metal strips to manufacture the PCB bridge; and wherein, the PCB bridge is employed in a vertical direction in a semiconductor assembly for interconnection of two or more semiconductor chips; wherein the vertical direction of the PCB bridge provides a flexible impedance matching by adjusting the dielectric material and a trace width of the PCB bridge, and wherein the vertical direction of the PCB bridge avoids signal reflections by matching the impedance to a source, and wherein a trace length of the PCB bridge is limited by spacing in between two semiconductor chips which further limited inductance of the trace of the PCB bridge.

BRIEF DESCRIPTION OF DRAWINGS

For a better understanding of the embodiments of the systems and methods described herein, and to show more clearly how they may be carried into effect, references will now be made, by way of example, to the accompanying drawings, wherein like reference numerals represent like elements/components throughout and wherein:

FIGS. 15A and 15B illustrate a top view and side view of a structure, for the PCB bridge, which is a strip line fanout type structure with embedded multi-layer capacitor, as signal layer with Multi-layer capacitor, in accordance with an embodiment of the present invention;

FIGS. 16A-16F show 3D views of the strip line fanout type structure of the PCB bridge with embedded multi-layer capacitor, in accordance with an embodiment of the present invention;

DETAILED DESCRIPTION OF INVENTION

This patent describes the subject matter for patenting with specificity to meet statutory requirements. However, the description itself is not intended to limit the scope of this patent. The principles described herein may be embodied in many different forms.

Illustrative embodiments of the invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

The present invention provides a method and a related apparatus for building an interconnection between two semiconductor chips for data communication between two different semiconductor chips that are assembled into one module, and to achieve maximum power transfer and ultra-high bandwidth transmission, while providing a flexibility for the impedance matching requirement.

The present invention employs a PCB bridge for finishing interconnection between two chips. The invention allows using one or more PCB bridges to interconnect more than two chips in a single architecture. The PCB bridge is employed in a vertical direction rather than horizontal direction.

The vertical alignment of the PCB bridge to interconnect chips avoids signal reflections by matching the PCB trace impedance to the source.

In an embodiment, the present invention provides an uncommon transmission line technique which is broadside coupled stripline. The signal reflections in PCB transmission lines can be avoided by matching the PCB trace impedance to the source.

Figure 1:
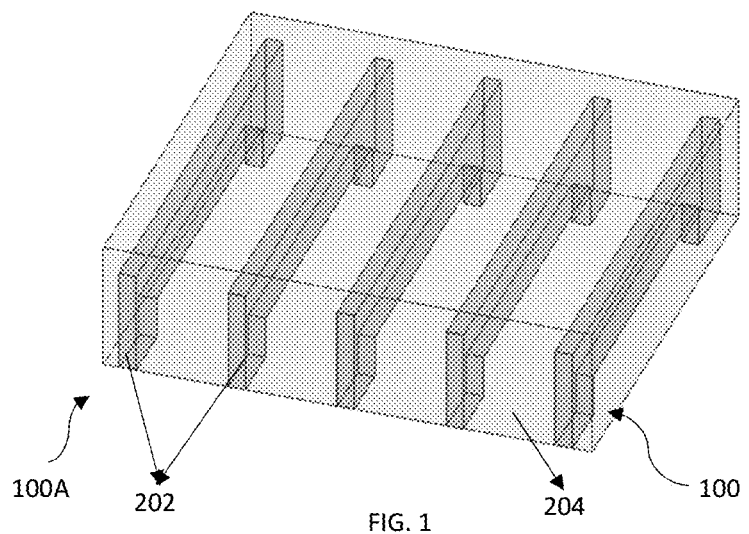
FIGS. 1-3 show a perspective view, a top view and a side view of the PCB bridge, in accordance with an embodiment.
Figure 2:
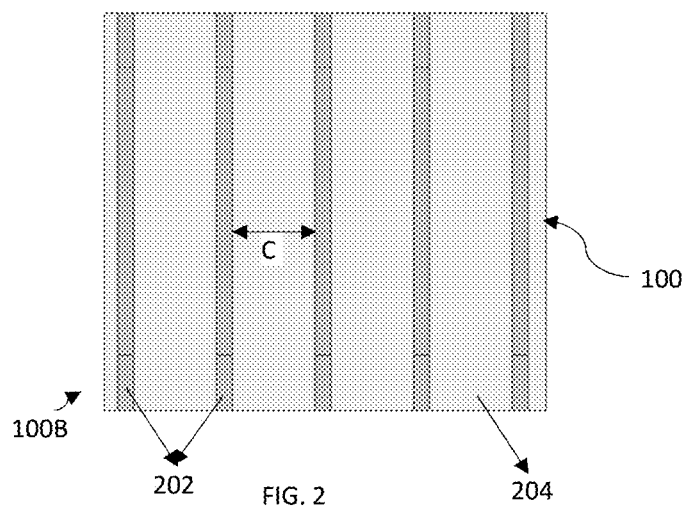
Figure 3:
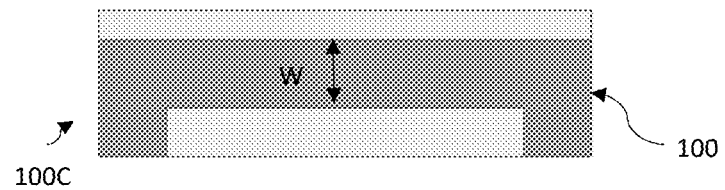

Referring to FIGS. 1-3 that shows a perspective view 100A, a top view 100B and a side view 100C of the PCB bridge, in accordance with an embodiment. The FIG. 1 shows the perspective view 100A of the PCB bridge 100. This PCB bridge 100 interconnects two or more semiconductor chips. The PCB bridge 100 consists of multiple metal strips 202, and a dielectric material 204 in between the metal strips 202. The metal strips 202 are embedded in the dielectric material 204. In an embodiment, the metal strips 202 are of copper, and the dielectric material 204 is prepreg. It may be apparent to a person ordinary skilled in the art that any type of suitable metal strips 202 for conduction and dielectric material can be used as an insulator in PCB bridge 100, without deviating from the meaning and scope of the present invention.

Figure 4:
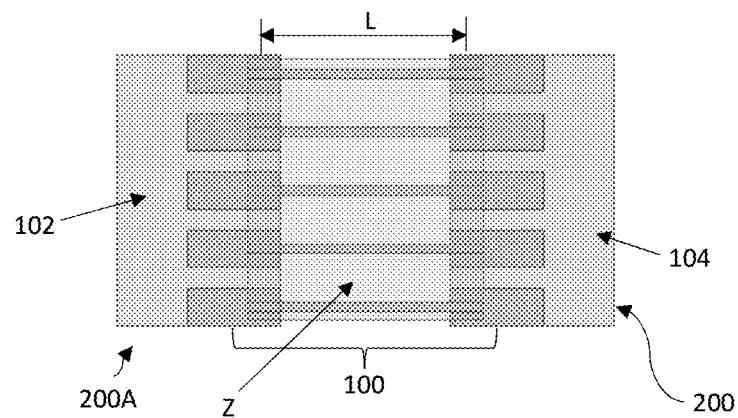
FIGS. 4-6 show a top view, a perspective view and a side view of an exemplary architecture for building an interconnection between two semiconductor chips using a PCB bridge, in accordance with an embodiment of the present invention.

As mentioned above, the PCB bridge 100 is employed in a vertical direction rather than horizontal direction in a semiconductor architecture. The vertical arrangement of the PCB bridge 100 provides a flexible impedance matching (Z, as shown in FIG. 4) by adjusting the dielectric material and the trace width (W, as shown in FIG. 3). In an embodiment, the trace length (L, as shown in FIG. 4) is normally limited by the spacing inbetween two chips which limited the inductance of the trace. The impedance matching (Z, as shown in FIG. 1) is dominated by the capacitance (C, as shown in FIG. 2) which is flexible in the architecture. A range of dielectric constant can be chosen between approximately 2-5 with different dielectric material. Also, the vertical arrangement of the PCB bridge 100 provides unlimited trace width (W, as shown in FIG. 3) that further raises the flexibility of impedance matching (Z).

Figure 5:
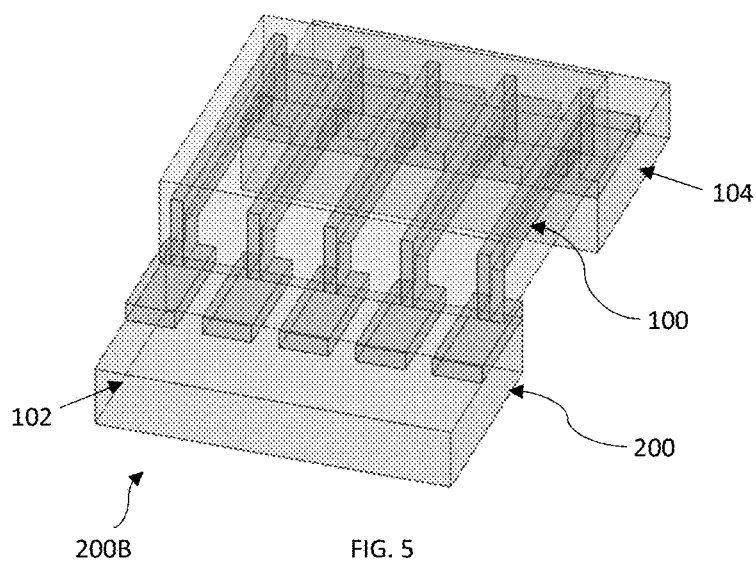
Figure 6:
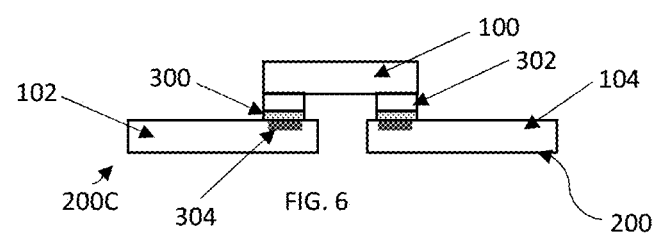

Referring to FIGS. 4-6 that show a top view 200A, a perspective view 200B and a side view 200C of an exemplary architecture for building an interconnection between two semiconductor chips using a PCB bridge, in accordance with an embodiment of the present invention. The top view 200A of the architecture in FIG. 4 shows a PCB bridge 100 which interconnects two chips 102 and 104. The PCB bridge 100 is employed in vertical direction, rather than a horizontal alignment. In an embodiment, prepreg 204 is used as a dielectric material in the architecture, as shown in cross sectional view of the PCB bridge 100 in FIG. 2. Prepreg 204 may be employed between two copper strips 202. It may be apparent to a person ordinary skilled in the art that any type of suitable dielectric material can be used as an insulator in the architecture of the PCB bridge 100, without deviating from the meaning and scope of the present invention. In another embodiment, prepreg 204 may be inserted between the copper strips 202 and a core of the architecture.

The PCB bridge 100 is mounted on the two chips 102 and 104 to provide interconnection between them by an SMT (Surface-Mount Technology) technique, according to an embodiment, as shown in side view 200C in FIG. 6. Soldering process is employed to fix the PCB bridge 100 over the two chips 102 and 104. The soldering process melts a solder 300 between the metalized pads/contacts of the PCB bridge 302 and the semiconductor chip connections 304. The soldering process is more favourable for non-destructive rework process. It may be apparent to a person ordinary skilled in the art that a suitable mounting technology or scheme can be used, other than SMT, in mounting of the components in the architecture 200, without deviating from the meaning and scope of the present invention. Additionally, it may be apparent to a person ordinary skilled in the art that a suitable metal joining process can be used, other than soldering process, in joining or connecting the PCB bridge 100 with the chips 102 and 104 in the architecture 200, without deviating from the meaning and scope of the present invention.

For packaging of the PCB bridge 100 in the semiconductor architecture 200, the PCB bridge 100 can be packaged in a standard tape and reel packaging which is suitable for existing component pick and place machine. In an embodiment, a standard pick and place process is employed to place the PCB bridge 100 in between two chips 102 and 104 which is favourable for mass production.

Further, the vertical arrangement of the PCB bridge 100 provides a flexible impedance matching (Z, see FIG. 4) by adjusting the dielectric material and the trace width (W, see FIG. 3). In an embodiment, the trace length (L, see FIG. 4) is normally limited by the spacing inbetween two chips 102 and 104 which limited the inductance of the trace. The impedance matching (Z, see FIG. 4) is dominated by the capacitance (C, see FIG. 2) which is flexible in the architecture 200. Because, the trace capacitance (C) is related to dielectric constant of different materials, the capacitance (C) is flexible by adjusting the dielectric constant, the dielectric material thickness and the area of the copper plates. A range of dielectric constant can be chosen between approximately 2-5 with different dielectric material. Also, the vertical arrangement of the PCB bridge 100 provides unlimited trace width (W, see FIG. 3) that further raises the flexibility of impedance matching (Z).

In an embodiment, the architecture of the PCB bridge 100 in vertical alignment may be used in multiple underlying structures such as including and not limited to GSGSG as example, also suitable for GSG, GSSG and SGS.

Figure 7:
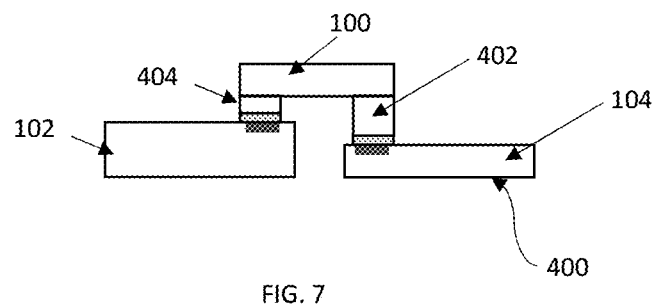
FIGS. 7, and 8A and 8B illustrate exemplary views for assembly processes providing solutions for various issues, including step different and tilting issues, respectively, using the PCB bridge architecture including the PCB bridge, in accordance with an embodiment of the present invention.
Figure 8A:
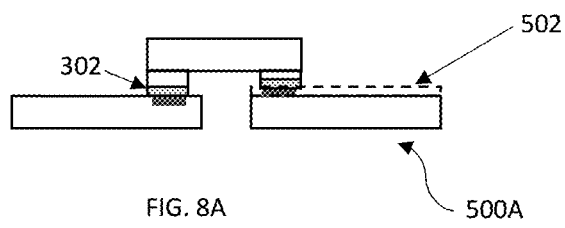
Figure 8B:
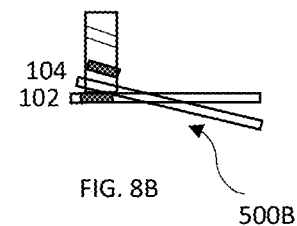

Referring to FIGS. 7, 8A and 8B that illustrate exemplary views for assembly processes providing solutions for various issues, including step different and tilting issues, respectively, using the PCB bridge architecture 200 including the PCB bridge 100, in accordance with an embodiment of the present invention. Manufacturing processes for the PCB bridges are generally laser cut techniques to cut legs/connectors for the bridges to connect with the chips. Thus, irregular shapes and sizes for the legs of the bridge 100 can be easily made by changing the laser cut pattern. Therefore, the step different can be compensated by the PCB bridge 100. As shown in FIG. 7, a different structure 400 of the architecture 200, that includes the PCB bridge 100 for interconnecting two chips 102 and 104, is made to solve the step different issue by forming one leg/connector 402 of the PCB bridge 100 longer than the other leg/connector 404 of the PCB bridge 100. As contrast, in the silicon bridge interconnection, the silicon bridge has a rectangular shape due to the fabrication process. Therefore, the flip chip process require very tight height requirement. The bonding may get open if there is step different between two chips. And in the wire bonding technique, a bit longer wire is to be used for step different between two chips.

Now, for solving the tilting issue in the assembly processes, as shown in side view 500A and front view 500B in FIGS. 8A and 8B respectively, an irregular shape with tilting 502 can be easily made in the PCB bridge 100 by tilting the PCB panel while doing laser cut. Therefore, the tilting issue can be compensated by the PCB bridge 100.

As contrast, in the silicon bridge interconnection, the silicon bridge has a rectangular shape due to the fabrication process. Therefore, the flip chip process require very tight tilting requirement. The bonding will get open if there is tilting between two chips. And in the wire bonding technique, a bit longer wire is to be used for tilting bonding between two chips.

Figure 9:
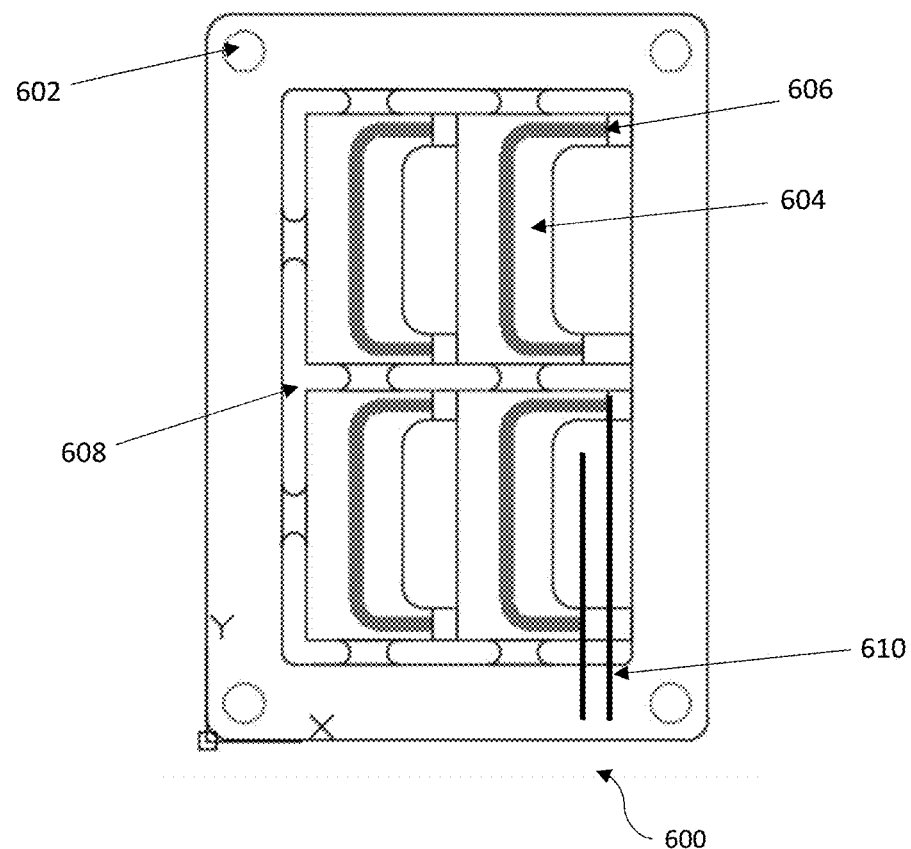
FIG. 9 illustrates an exemplary process for PCB panel cutting process for PCB bridge, in accordance with an embodiment of the present invention.

Referring to FIG. 9 that illustrates an exemplary process for PCB panel cutting process for PCB bridge, in accordance with an embodiment of the present invention. The PCB bridge 100 is cut out by using laser cut technique, in an embodiment. A PCB panel 600 is fixed at the panel fixtures 602 at the corners for a PCB 604. Laser cut lines 608 are drawn and cut along to manufacture the PCB bridge 100. Multiple copper wires or strips 606 are fixed on the PCB 604. These copper wires or strips 606 are corresponding to the metal wires or strips 202 in the PCB bridge 100, as shown in the FIGS. 1-3.

In an embodiment, while doing the laser cut to cut out the PCB bridge 100, a step difference 610 of the PCB bridge can be made by changing the size of the PCB outline. Additionally, in an embodiment, the tilting PCB bridge can also be made by tilting the panel fixture 602 while doing laser cut.

FIGS. 10A-15B show the architecture of the PCB bridge 100 with various additional features, according to different embodiments of the present invention.

Figure 10A:
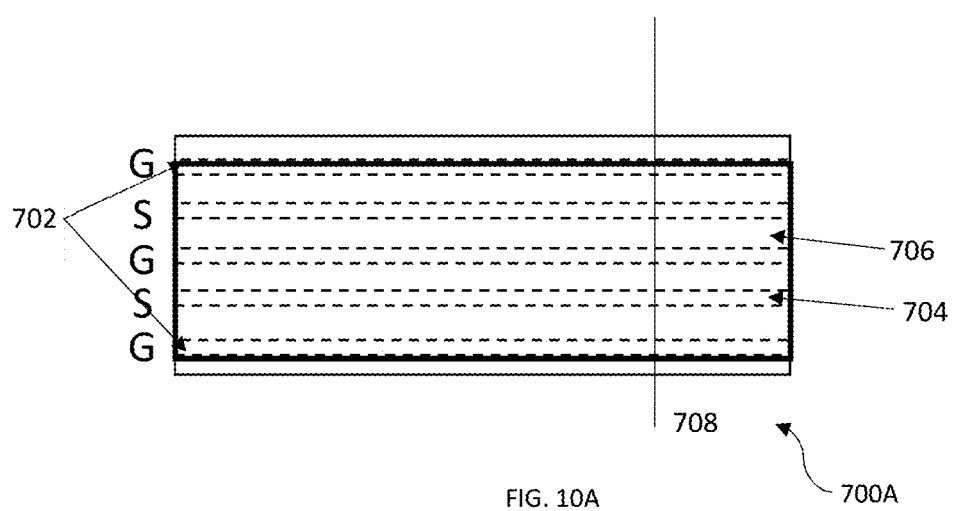
FIGS. 10A, 10B and 10C show a top view, a cross sectional view and a 3D view for a fully shielded strip line structure of the PCB bridge, in accordance with an embodiment of the present invention.
Figure 10B:
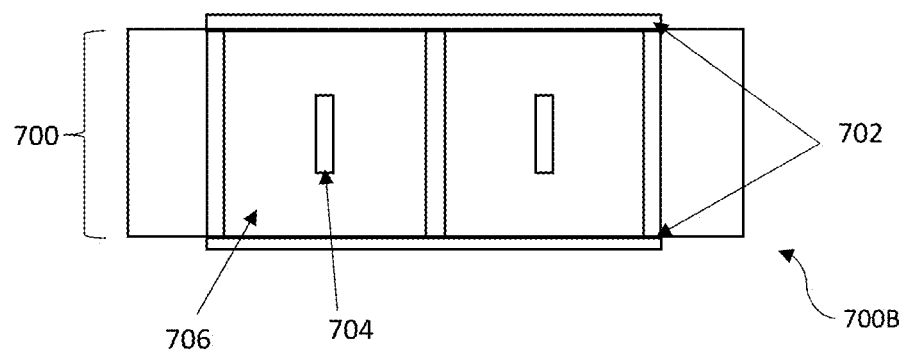
Figure 10C:
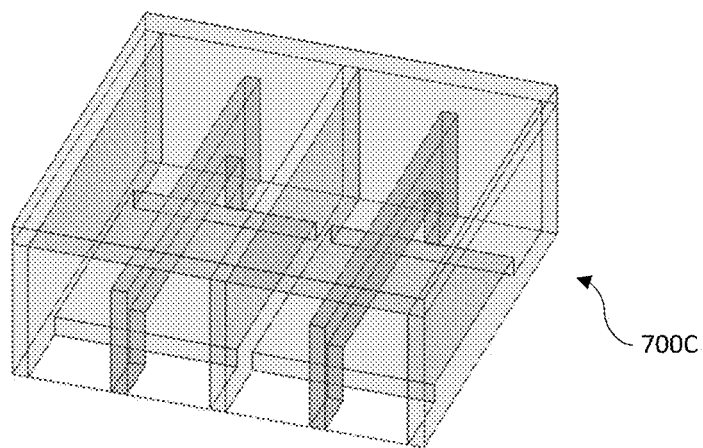

FIGS. 10A, 10B and 10C show a top view 700A, a cross sectional view 700B and a 3D view 700C for fully shielded strip line structure 700 of the PCB bridge 100. In the top view 700A and the cross sectional view 700B, the PCB bridge 100 may include metal deposition layers 702 at the top and bottom. In an embodiment, metal deposition layers 702 are of copper. Further, multiple copper strips 704 are disposed with a dielectric material 706 in between. In an embodiment, the dielectric material 706 is prepreg.

The cross sectional view 700B is across the cross sectional line 708 of the top view 700A.

In conventional PCB and silicon fabrication, metalized via is used for forming the connection between different layer. However, there is a via to via spacing requirement in different fabrication process. That means the strip copper cannot be fully shield by using the conventional fabrication process.

Electromagnetic shielding is the practice of reducing the electromagnetic field in a space by blocking the field with barriers made of conductive or magnetic materials. The via to via spacing induce electromagnetic field leakage to the signal strip and affect the signal integrity. The fully shielded strip line structure 700 formed a great electromagnetic field barriers, because the fully shielded strip line structure 700 is shielded by the top and bottom metal deposition layers 702 and the inbetween filling of the dielectric material 706. Thus, the fully shielded strip line structure 700 blocks the noise interference from the space.

Figure 11A:
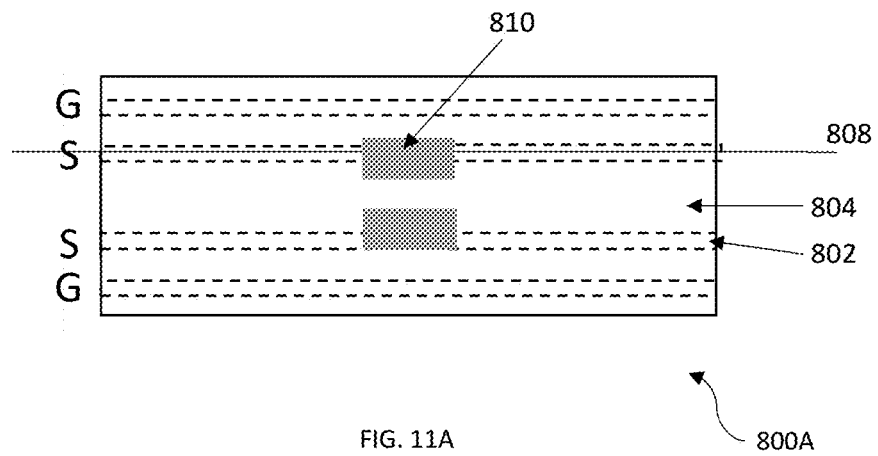
FIGS. 11A, 11B and 11C show a top view, a cross sectional side view and a 3D view for a structure of the PCB bridge with an external component, e.g., a capacitor on top strip line structure, in accordance with an embodiment of the present invention.
Figure 11B:
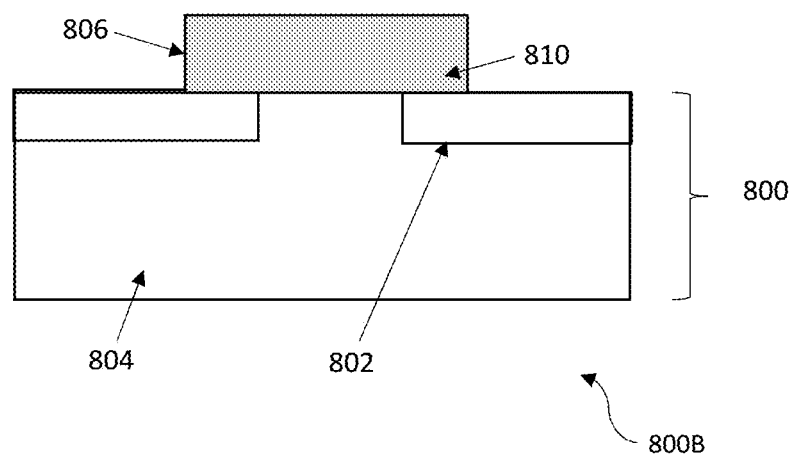
Figure 11C:
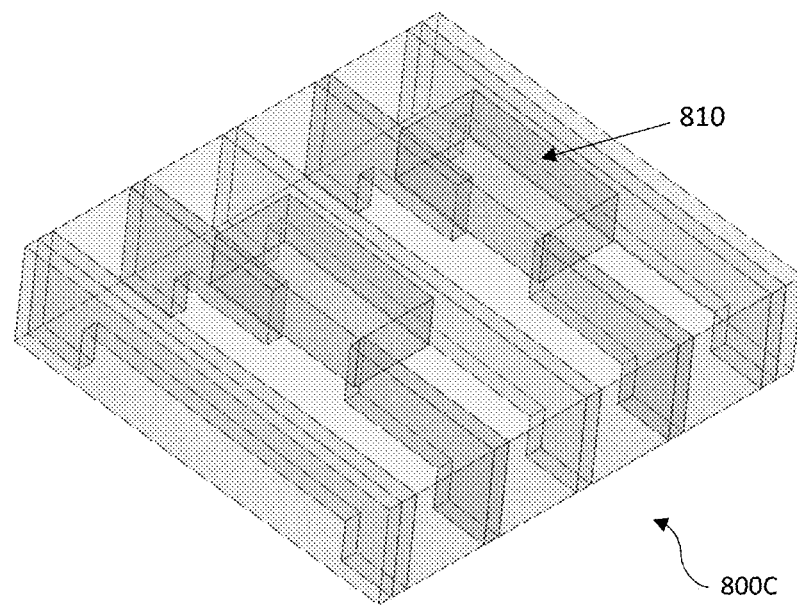

FIGS. 11A, 11B and 11C show a top view 800A, a cross sectional side view 800B and a 3D view 800C for a structure 800 of the PCB bridge 100 with an external component 810, e.g., a capacitor on top strip line structure. In the top view 800A and the cross sectional view 800B, the PCB bridge 100 may include multiple copper strips 802 disposed with a dielectric material 804 in between. In an embodiment, the dielectric material 804 is prepreg. Additionally, in the external component 810 on top strip line type structure 800, a cap 806 is disposed over the copper strips 802.

The cross sectional side view 800B is across the cross sectional line 808 of the top view 800A.

In an embodiment, the external component can be any of an inductor, a capacitor, a resistor, a ferrite bead, and the like components without any limitations.

External component 810 (such as inductor, capacitor, resistor and ferrite bead) can be added on the top of the PCB bridge 100 for different purpose which depend on different design.

For example, in data communication circuit design, a series connected capacitor is used for passing all AC signal and blocking all DC signal. It is necessary in the signal path in order to tackle the voltage bias variation in different systems. This variation of the voltage bias mainly due to different systems design or the offset of the operation IC. This additional capacitor used up some of the space in the main PCB. Moreover, the capacitor can only be placed at the top or bottom layer of the PCB. This increase the routing signal path length and number of via if inner layer stripline design is used. Thus, it increases the resistivity loss.

Adding the external capacitor 810 on top provides an additional choice of capacitor placement which can free up some of the spacing in the main PCB. At the same time, it smooths the routing signal path and reduce the resistivity loss.

Figure 12A:
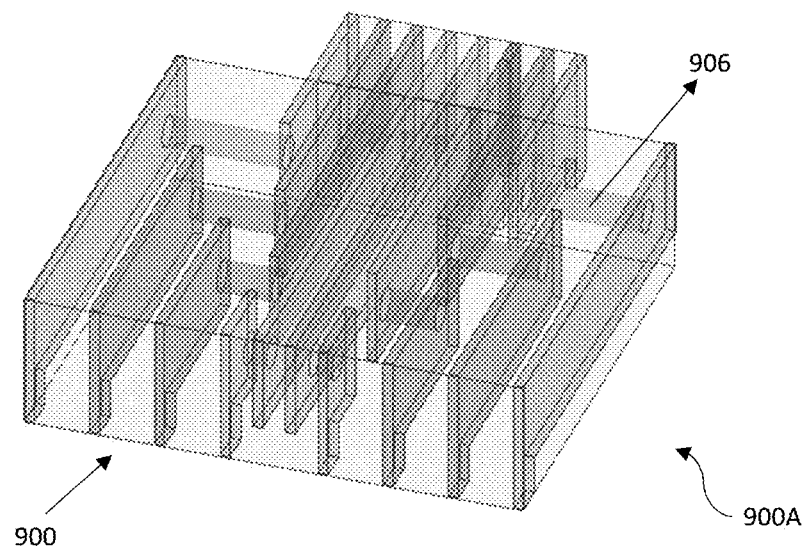
FIG. 12A shows a 3D view.
Figure 12B:
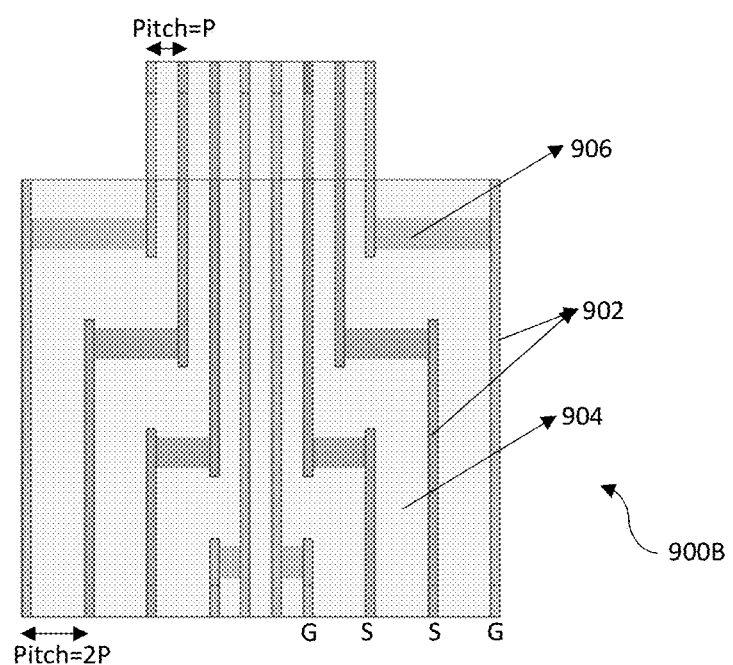
FIG. 12B shows a top view and FIG. 12C shows a cross sectional view of a strip line fanout type structure of the PCB bridge, in accordance with an embodiment of the present invention.
Figure 12C:
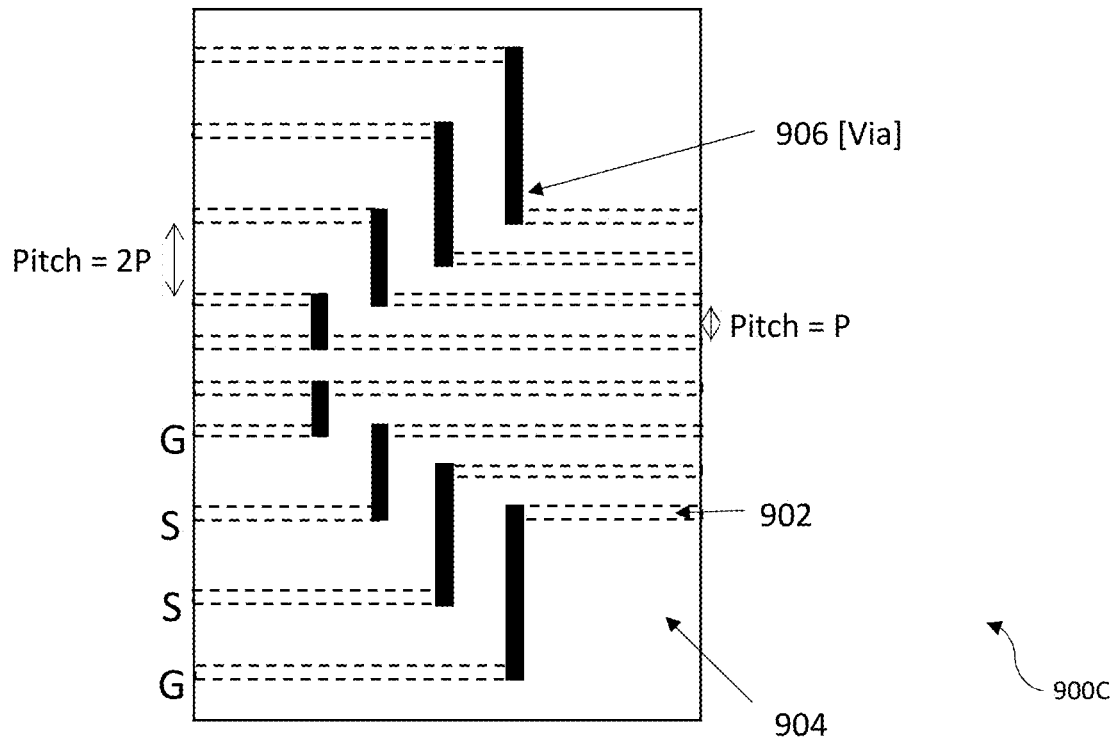

FIG. 12A shows a 3D view 900A, FIG. 12B shows a top view 900B and FIG. 12C shows a cross sectional view 900C of the strip line fanout type structure 900. The structure 900 of the PCB bridge 100 may include multiple copper strips 902 disposed with a dielectric material 904 in between. In an embodiment, the dielectric material 904 is prepreg. The copper strips 902 in the fanout structure are not straight disposed, but include a via (any conductive material) 906 in between that connects two parts of the same copper strip 902, where the two parts of the same copper strip are parallelly spaced with each other, and the via 906 is between the two parallel copper strips 902. In an embodiment, the via 906 is of copper. Further, the fanout structure has two pitches, one pitch 'P' and the other is twice the pitch, which is '2P'. '2P' pitch is the distance between a copper strip 902 from the central copper strip 902.

In a conventional PCB fabrication, the trace spacing is limited by the fabrication process. Thus, a more precision fabrication process is needed in order to meet the trace spacing requirement such PCB substrate or silicon fabrication that greatly increase the fabrication lead time and BOM cost. But, the strip line fanout structure for the PCB bridge 100, according to the invention, increases the trace pitch for more than 2 times. Therefore, it relaxes the fabrication requirement of the fanout side and make PCB fabrication become one of the suitable choice.

Figure 13A:
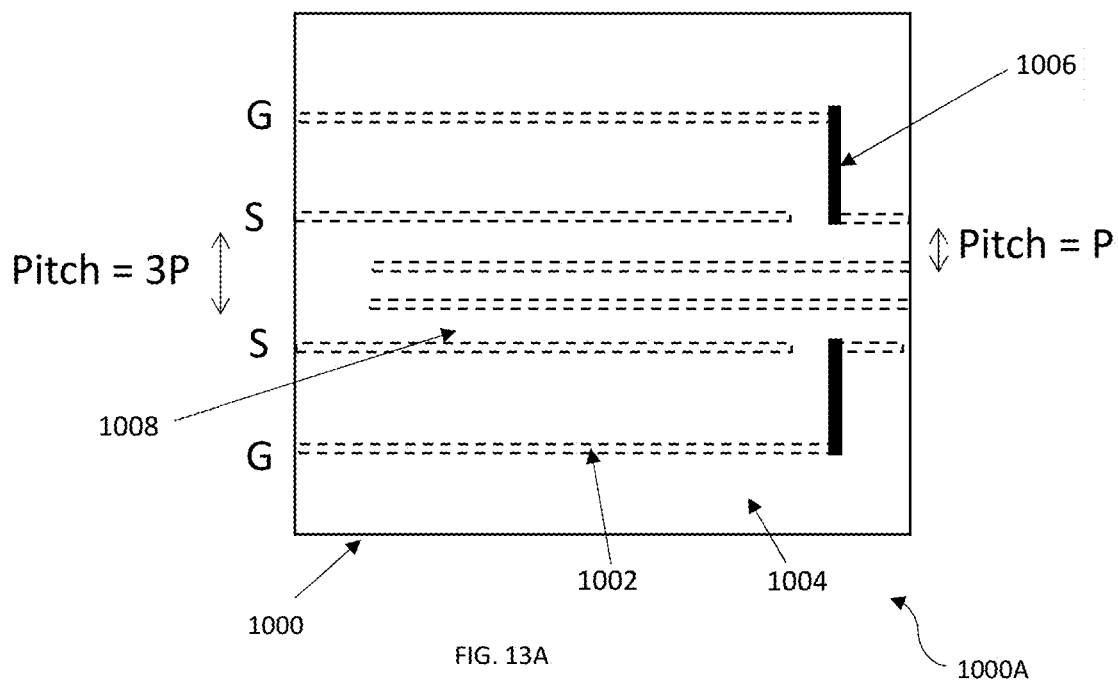
FIG. 13A shows a cross sectional view of FIG. 13B, in accordance with an embodiment of the present invention.

Referring to FIG. 13A which is the cross sectional view 1000A of a structure of the PCB bridge 100 which is a strip line fanout type structure 1000 with embedded single layer capacitor, the structure 1000 of the PCB bridge 100 may include multiple copper strips 1002 disposed with a dielectric material 1004 in between. In an embodiment, the dielectric material 1004 is prepreg. All copper strips 1002 in the fanout structure may not be all straight disposed, but include a via (any conductive material) 1006 in between that connects two parts of the same copper strip, where the two parts of the same copper strip are parallelly spaced with each other, and the via 1006 is between the two parallel copper strips. In an embodiment, the via 1006 is of copper. The structure also includes single layer capacitor 1008 in between two copper strips 1002. Further, the fanout structure has two pitches, one pitch 'P' and the other is thrice the pitch, which is '3P'.

The additional capacitor 1008 can be embedded in the PCB instead of using as an external capacitor, as used in the FIG. 11A-C. Two copper strips 1002 with the dielectric material 1004 in between form a single layer capacitor for data communication circuit design. Therefore, the SMT process for the external capacitor can be bypassed. That speed up the whole assembly process. At the same time, the pitch can also be increased for relaxing the fabrication process of the chip. The pitch can be adjusted to '2P' or more by inserting the dielectric layer and changing the design.

Figure 13B:
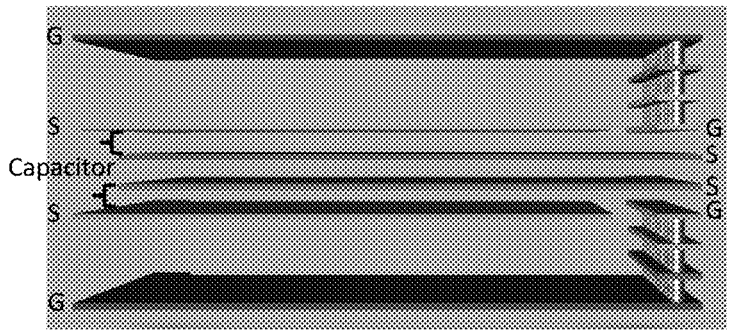
FIG. 13B shows a 3D point view of the 3D structure view shown in the FIG. 13D.
Figure 13C:
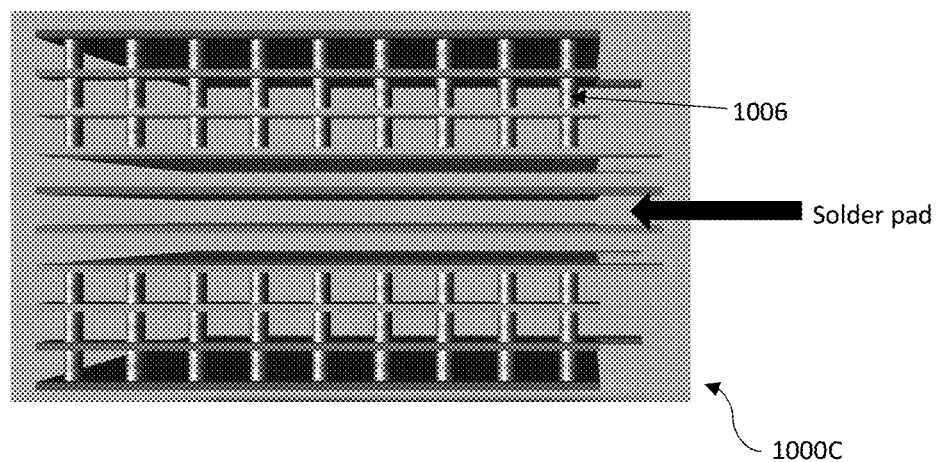
FIG. 13C shows a 3D point view of the 3D structure view in the FIG. 13D.
Figure 13D:
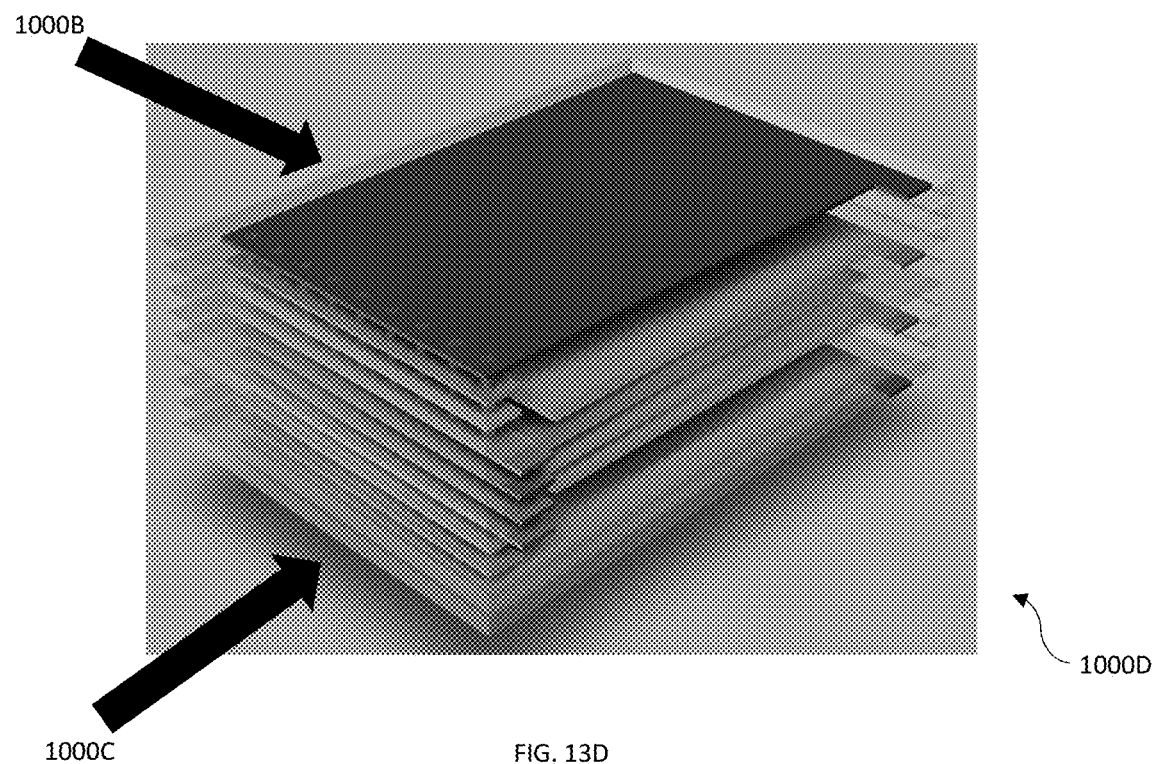
FIG. 13D shows a 3D structure view for a structure of the PCB bridge which is a strip line fanout type structure with embedded single layer capacitor.

FIG. 13D shows a 3D structure view for the structure 1000 which is a strip line fanout type structure 1000 with embedded single layer capacitor. FIG. 13B shows a 3D point view 1000B of the 3D structure view 1000D in FIG. 13D, whereas, FIG. 13C shows a 3D point view 1000C of the 3D structure view 1000D in FIG. 13D.

For calculating the capacitance, in FIGS. 13A-D, 14A-B and 15A-B, following formula can be used.

$$C = \frac{\varepsilon_0 \varepsilon_r A}{d}$$

Figure 14A:
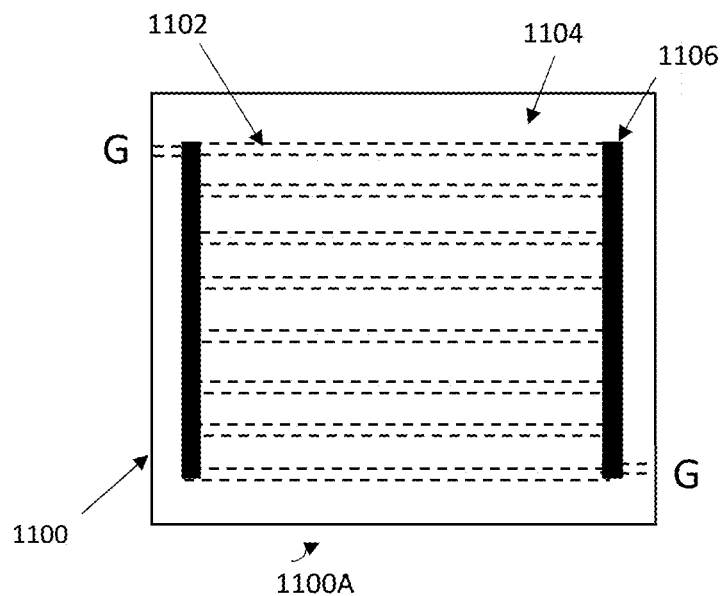
FIGS. 14A and 14B illustrate a top view and side view of a structure, for the PCB bridge, which is a strip line fanout type structure with embedded multi-layer capacitor, as ground layer, in accordance with an embodiment of the present invention.
Figure 14B:
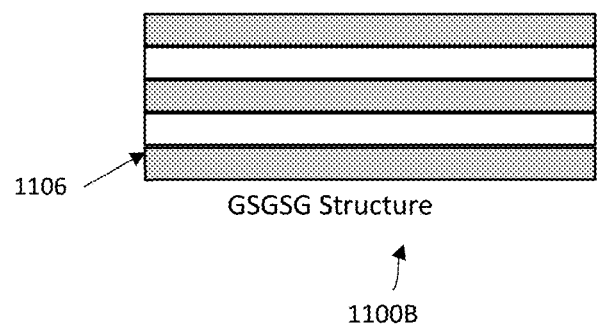

C: parallel plate capacitance
$\varepsilon_r$: dielectric constant of material
$\varepsilon_0$: dielectric constant of free space
A: area of plate
d: distance between two plates FIGS. 14A and 14B illustrate a top view 1100A and side view 1100B of a structure 1100, for the PCB bridge 100. The structure 1100 is a strip line fanout type structure with embedded multi-layer capacitor, as ground layer. The structure of the PCB bridge 100 may include multiple copper strips 1102 disposed with a dielectric material 1104 in between. In an embodiment, the dielectric material 1104 is prepreg. All copper strips 1102 in the structure are connected at the end using a via 1106 (any suitable conductive material). The structure is of a ground layer. In an embodiment, the via 1106 is of copper.

Figure 15A:
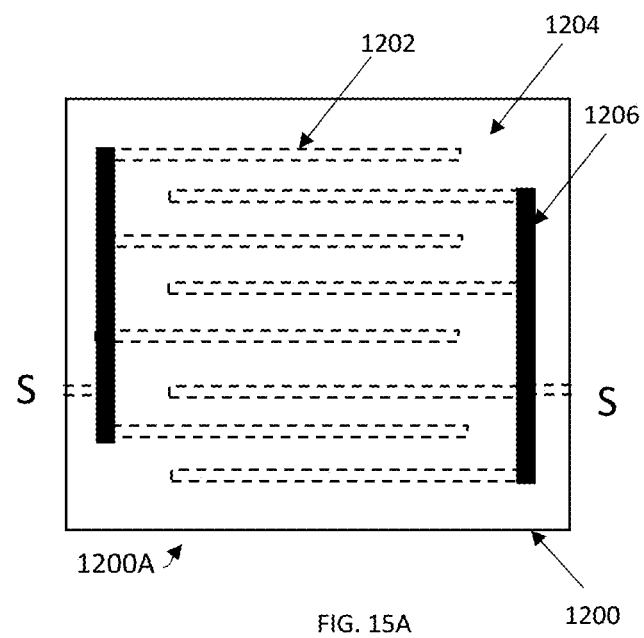

FIGS. 15A and 15B illustrate a top view 1200A and side view 1200B of a structure 1200, for the PCB bridge 100, which is a strip line fanout type structure 1200 with embedded multi-layer capacitor, as signal layer with Multi-layer capacitor. The structure 1200 of the PCB bridge 100 may include multiple copper strips 1202 disposed with a dielectric material 1204 in between. In an embodiment, the dielectric material 1204 is prepreg. Alternate copper strips 1202 in the structure 1200 are connected at the end using a via 1206 (which can be any suitable conductive material 1206). The structure 1200 is of a signal layer with Multi-layer capacitor. In an embodiment, the via 1206 is of copper.

In the FIGS. 14A-B and 15A-B, the additional capacitor can be embedded in the PCB instead of using external capacitor by multi-layer capacitor for data communication circuit design. It makes a more compact design for the PCB bridge 100 and reduce the number of layers in PCB.

Figure 16C:
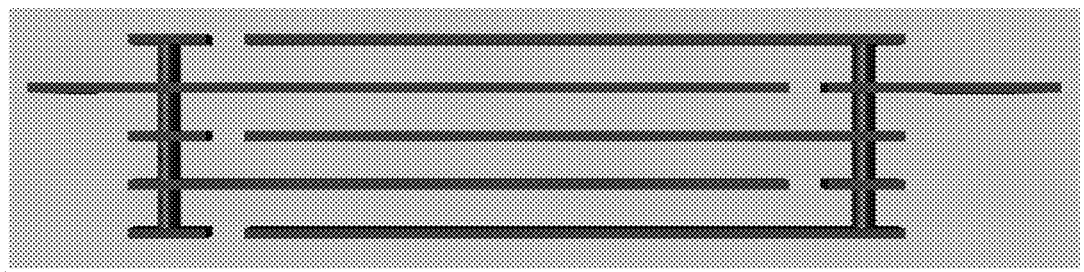

FIGS. 16A-16F show 3D views 1300A-1300F of a structure 1300 which is a strip line fanout type structure 1300 of the PCB bridge 100 with embedded multi-layer capacitor. FIG. 16A shows the 3D view 1300A with the copper strips in GSGSG pattern, disposed with a dielectric material in between. In an embodiment, the dielectric material is prepreg. The structure 1300 includes a via 1302 (any conductive material) in between the copper strips. In an embodiment, the via 1302 is of copper.

The FIG. 16B shows a 3D view 1300B of the G pattern metal strip of the PCB bridge 100 in the strip line fanout type structure 1300 with embedded multi-layer capacitor, whereas FIG. 16C shows a 3D view 1300C of the S pattern metal strip of the PCB bridge 100 in the strip line fanout type structure 1300 with embedded multi-layer capacitor.

Figure 16D:
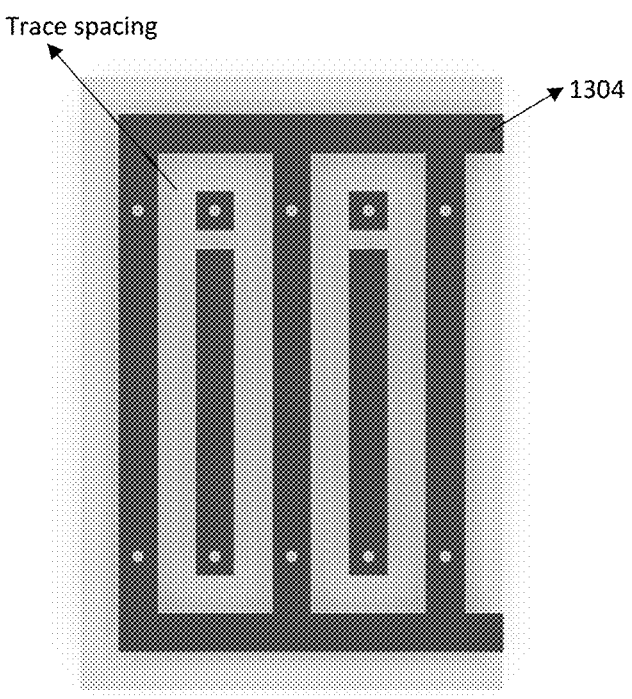
Figure 16E:
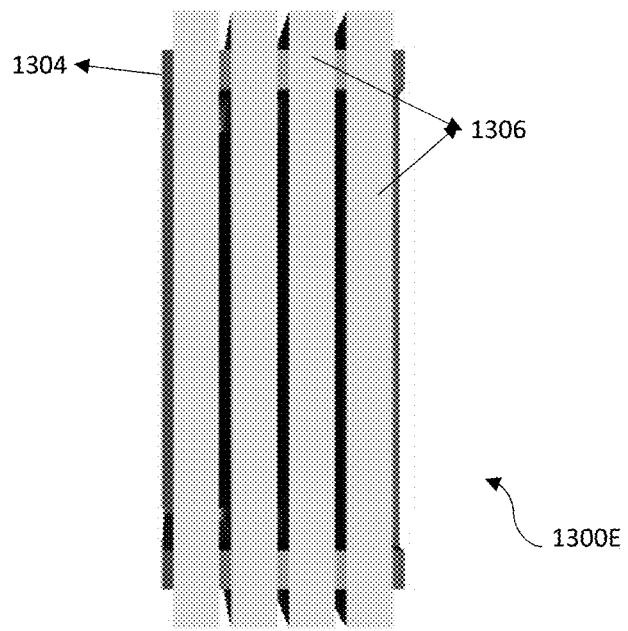
Figure 16F:
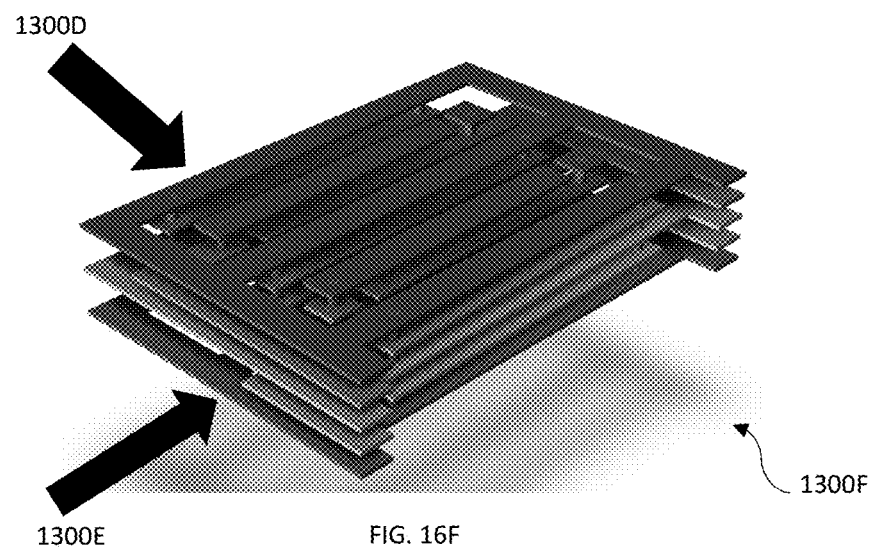

The FIG. 16D shows a 3D top view 1300D of the PCB bridge 100 of the strip line fanout type structure 1300 with embedded multi-layer capacitor, where the solder pads 1304 are illustrated, and trace spacing is visible between the copper strips. The FIG. 16E shows a 3D view 1300E of the PCB bridge 100 of the strip line fanout type structure 1300 with embedded multi-layer capacitor, where the dielectric 1306 is illustrated. Further, the FIG. 16F shows a 3D view 1300F of the PCB bridge 100 of the strip line fanout type structure 1300 with embedded multi-layer capacitor, where the 3D view 1300F includes the 3D point view 1300D of the 3D structure view 1300D in FIG. 16D and the 3D point view 1300E of the 3D structure view 1300E in FIG. 16E.

Figure 17A:
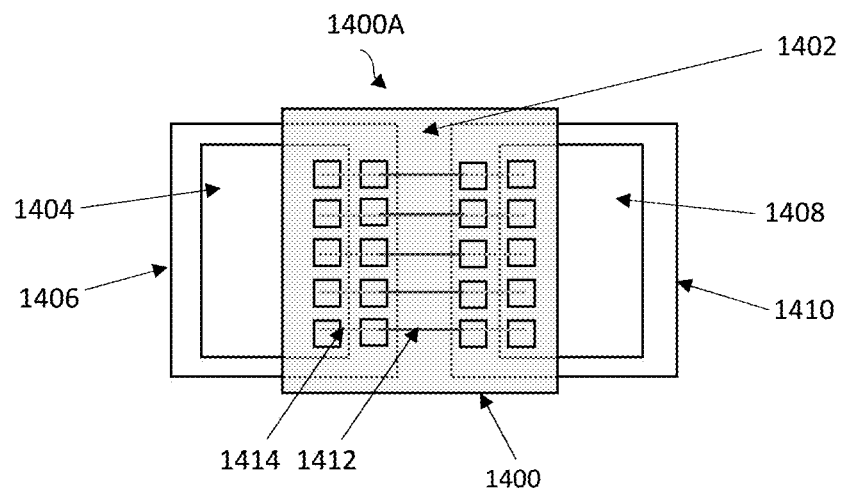
FIG. 17A shows a top view and FIG. 17B shows a side view of the 3D stacking structure.
Figure 17B:
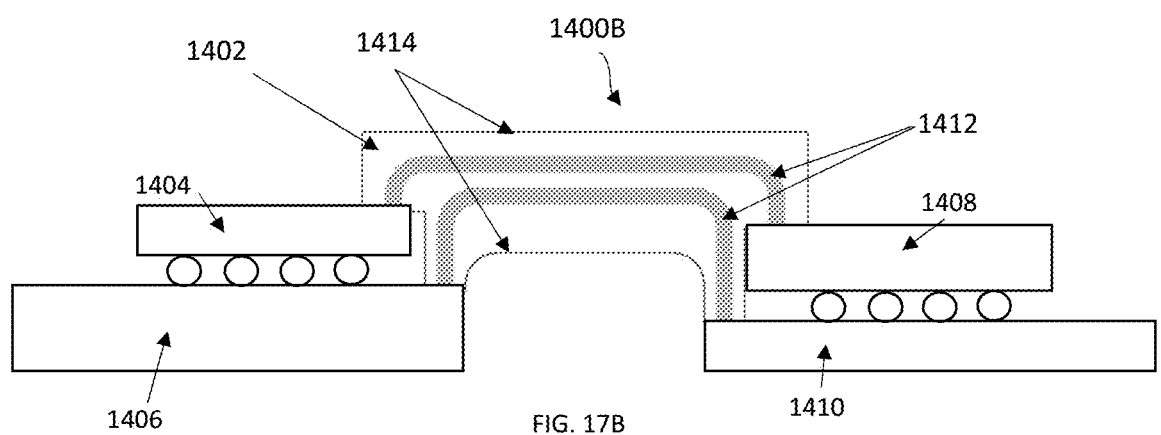
Figure 18:
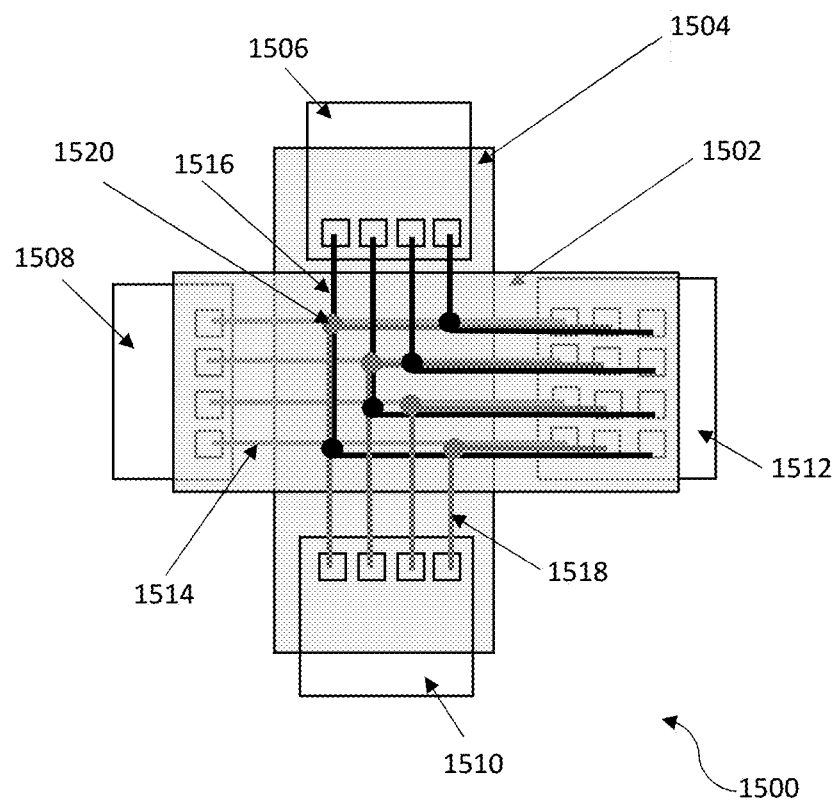
FIG. 18 shows a 3D fanout crossing structure, in accordance with an embodiment of the present invention.

The PCB bridge 100 can not only allow for 2D structures, but also can build 3D interconnections between the chips, as shown in FIGS. 17A-17B and 18. FIG. 17A shows the top view 1400A and FIG. 17B shows the side view 1400B of the stacking structure. According to an embodiment, in the 3D stacking structure 1400, the PCB bridge 1402 connects 4 chips, 1404, 1406, 1408 and 1410. The chips 1404, 1406 are stacked on one another, and chips 1408 and 1410 are stacked on one another. The stacked combination of chips 1404 and 1406 is then interconnected via the PCB bridge 1402 to the stacked combination of chips 1408 and 1410. Due to the vertical arrangement of the PCB bridge 1402, this type of 3D stacking structure 1400 is possible in the present invention.

Further, the vertical legs/connections 1412 and 1414 of the PCB bridge 1402 vertically interconnects the 4 chips, 1404, 1406, 1408 and 1410.

In an embodiment, a 3D crossing structure can also be used to connect two different signal. Two PCB bridges are stacked together and formed an independent crossing connection. This structure is suitable to use in the space limited design with two independent connection.

Another possible structure because of the vertical arrangement of the PCB bridge in the present invention, is shown in FIG. 18. FIG. 18 shows a 3D fanout crossing structure 1500. A 3D fanout crossing structure 1500 can be used to fanout a chip signal into three ways. Two PCB bridges (e.g. 1502 and 1504) are stacked together and formed an fanout crossing connection. This structure 1500 is suitable to used in the space limited design with fanout connection. According to an embodiment, in the 3D fanout crossing structure 1500, two PCB bridges 1502 and 1504 are used which connects 4 chips, 1506, 1508, 1510 and 1512. The chips 1506, 1510 are facing opposite to each other, and chips 1508 and 1512 are facing opposite to each other. The chips 1506, 1508 and 1512 are each interconnected to the chip 1512. Thus, a 3D fanout crossing interconnection structure is built. According to an embodiment, in the 3D fanout crossing structure 1500, the chip 1508 is interconnected via the legs/connections 1514 of the PCB bridge 1502 to the chip 1512. To interconnect the chip 1506 with the chip 1512, interconnections 1516 are built, which is built using the legs/connections 1514 of the PCB bridge 1502 connecting via the connections nodes 1520 to the legs/connections of the PCB bridge 1504. Similarly, to interconnect the chip 1510 with the chip 1512, interconnections 1518 are built.

Due to the vertical arrangement of the PCB bridges 1502 and 1504, this type of 3D crossing structure 1500 is possible in the present invention.

Figure 19:
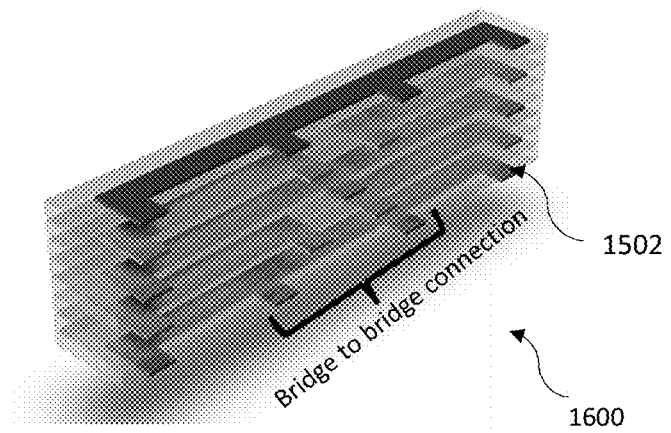
FIGS. 19; and 20A and 20B show 3D views of the PCB bridges used in the 3D crossing structure, respectively. 3D views in FIGS. 19 and 20A and 20B show bridge to bridge connections.
Figure 20A:
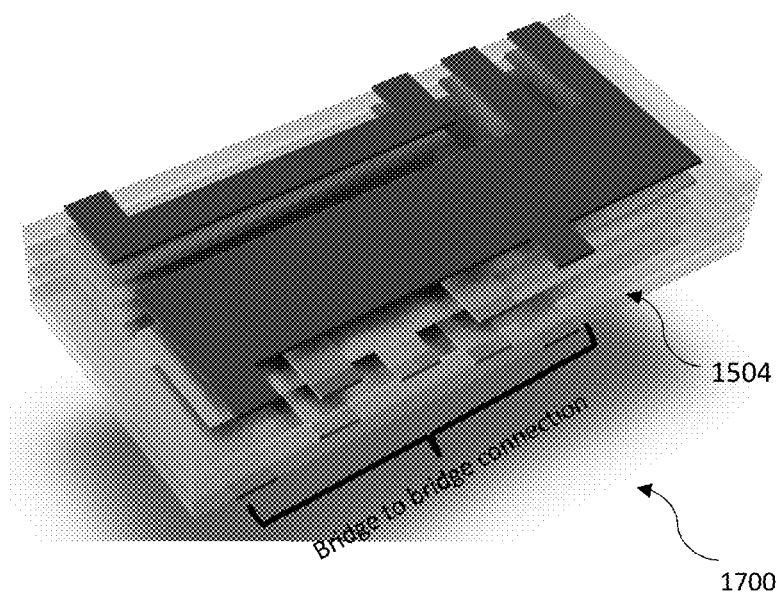
FIG. 20A shows a top view of one PCB bridge.
Figure 20B:
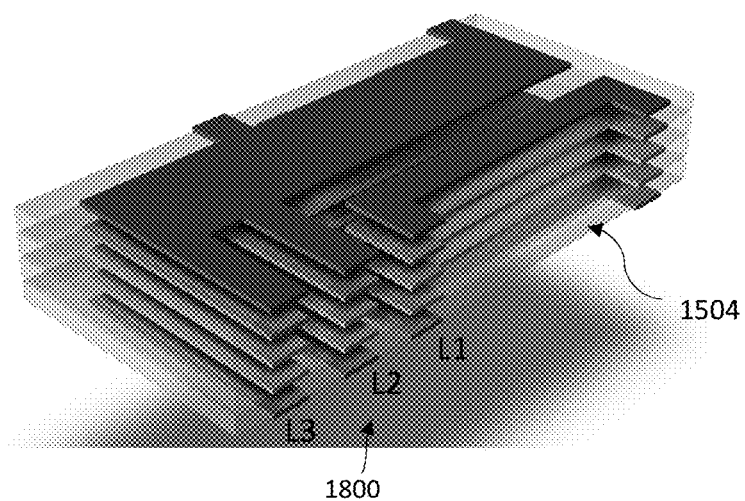
FIG. 20B shows a bottom view of one PCB bridge, and the bottom view shows three L1, L2 and L3 leg connections of the PCB bridge connections.
Figure 21:
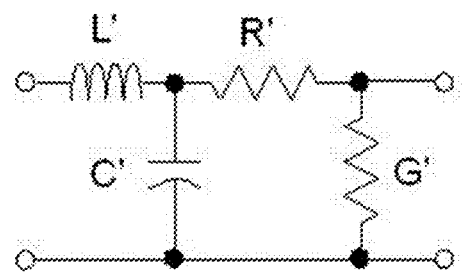
FIG. 21 shows a model using an infinitesimally small section of a transmission line with four elements in the prior art.

FIG. 19 shows a 3D view 1600 of the PCB bridges 1502, and FIGS. 20A-B show 3D views 1700 and 1800 of the PCB bridge 1504 used in the 3D crossing structure 1500, respectively. 3D views 1600, 1700 and 1800 show bridge to bridge connections. FIG. 20A shows a top view 1700 of one PCB bridge, and FIG. 20B shows a bottom view 1800 of one PCB bridge, and the bottom view 1800 shows three L1, L2 and L3 leg connections of the PCB bridge connections.

Advantageously, the vertical alignment structure of the PCB bridge provides many advantages for the PCB bridge. The dielectric is selectable with many types of prepreg, this provides a flexibility for the impedance matching requirement. The trace width will be extended in vertical direction instead of horizontal which means there is no limitation for the trace width selection. PCB bridge uses SMT soldering process for bonding which is favourable for non-destructive rework process.

The PCB bridge is available in irregular shape by adjusting the laser cutting pattern. The stepping and tilting issue between two chips can be handled by PCB bridge.

It provides a similar impedance matching performance while having a lower packaging requirement than silicon bridge.

Numerous variations, whether explicitly given in the specification or not, such as differences in structure, dimension, and use of material, are possible. Benefits, other advantages, and solutions to problems have been described above with regard to specific embodiments. However, the benefits, advantages, solutions to problems and any component(s) that may cause any benefit, advantage, or solution to occur or become more pronounced are not to be construed as a critical, required, or essential feature or component of any or all the claims.

Also, it is low cost, provides good impedance matching, and is reworkable and flexible.

It is intended that the disclosure and examples be considered exemplary only. Though the present disclosure includes examples from semiconductors chips or assembly, the PCB bridge architecture disclosed herein may be employed for various applications as would be appreciated by one skilled in the art. The references to devices and architectures used here are intended to be applied or extended to the larger scope and should not be construed as restricting the scope and practice of the present invention.

The invention claimed is:

1. A PCB bridge for interconnection of two or more semiconductor chips for data communication between the semiconductor chips, comprising:
   a plurality of metal strips, where each metal strip is aligned one after the other, and each metal strip has two legs or connectors to contact and connect with connection pads on the semiconductor chips, and wherein shape and size of the two legs or connectors of each metal strip is cutout, using a cutting technique, to be either same or different from each other; and
   a dielectric material disposed in between the plurality of metal strips,
   wherein, the PCB bridge is employed in a vertical direction in a semiconductor module for interconnection of two or more semiconductor chips,
   wherein the vertical direction of the PCB bridge provides a flexible impedance matching by adjusting the dielectric material and a trace width of the PCB bridge, and
   wherein the vertical direction of the PCB bridge avoids signal reflections by matching the impedance to a source, and
   wherein a trace length of the PCB bridge is limited by spacing in between two semiconductor chips which further limited inductance of the trace of the PCB bridge.

2. The PCB bridge of claim 1, wherein the plurality of metal strips is made of copper, and the dielectric material is prepreg, and wherein the vertical arrangement of the PCB bridge provides unlimited trace width that further raises flexibility of the impedance matching.

3. The PCB bridge of claim 2, wherein the dielectric material has a dielectric constant ranging from 2-5.

4. The PCB bridge of claim 2, wherein the PCB bridge is manufactured using laser cut techniques to cutout the legs or connectors of the metal strips to provide them either regular or irregular shapes and sizes by changing a laser cut pattern.

5. The PCB bridge of claim 4, wherein the PCB bridge with flexible shapes and sizes of the legs or connectors of the metal strips compensates for a step different issue in a semiconductor module by forming one leg or connector of the metal strip longer than other leg or connector of the metal strip.

6. The PCB bridge of claim 4, wherein the PCB bridge with flexible shapes and sizes of the legs or connectors of the metal strips compensates for a tilting issue in a semiconductor module by tilting a PCB panel while doing the laser cut pattern during the laser cut techniques.

7. The PCB bridge of claim 4, wherein the PCB bridge is manufactured as a fully shielded strip line PCB bridge structure, wherein the fully shielded strip line PCB bridge structure further includes one or more metal deposition layers at a top and a bottom of fully shielded strip line PCB bridge structure in addition to the plurality of metal strips and the dielectric material disposed in between the plurality of metal strips; and
   wherein the fully shielded strip line PCB bridge structure forms electromagnetic field barriers as it is shielded by the top and bottom metal deposition layers and the inbetween filling of the dielectric material, the fully shielded strip line PCB bridge structure blocking noise interference from space.

8. The PCB bridge of claim 4, wherein the PCB bridge is manufactured as a strip line PCB bridge structure with an external component on top, wherein the strip line PCB bridge structure with an external component on top further includes an external component on top of the PCB bridge in addition to the plurality of metal strips and the dielectric material disposed in between the plurality of metal strips, and wherein the external component is at least one of an inductor, a capacitor, a resistor or a ferrite bead.

9. The PCB bridge of claim 4, wherein the PCB bridge is manufactured as a strip line fanout type PCB bridge structure, wherein the strip line fanout type PCB bridge structure further includes a conductive material in between the plurality of metal strips that connects each two metal strips of the plurality of metal strips in addition to the plurality of metal strips and the dielectric material disposed in between the plurality of metal strips; and wherein the strip line fanout type PCB bridge structure has two pitches, one pitch 'P' and the other is twice the pitch 'P'.

10. The PCB bridge of claim 4, wherein the PCB bridge is manufactured as a strip line fanout type PCB bridge structure with embedded single layer capacitor, wherein the strip line fanout type PCB bridge structure with embedded single layer capacitor further includes a conductive material in between the plurality of metal strips that connects each two metal strips of the plurality of metal strips; and a single layer capacitor embedded in between two metal strips, in addition to the plurality of metal strips and the dielectric material disposed in between the plurality of metal strips.

11. The PCB bridge of claim 4, wherein the PCB bridge is manufactured as a strip line fanout type PCB bridge structure with embedded multi-layer capacitor, as ground layer, wherein the strip line fanout type PCB bridge structure with embedded multi-layer capacitor further includes a conductive material that connects all of the plurality of the metal strips together at their end, in addition to the plurality of metal strips and the dielectric material disposed in between the plurality of metal strips.

12. The PCB bridge of claim 4, wherein the PCB bridge is manufactured as a strip line fanout type PCB bridge structure with embedded multi-layer capacitor, as signal layer, wherein the strip line fanout type PCB bridge structure with embedded multi-layer capacitor further includes a conductive material that connects alternate metal strips at their end in the plurality of the metal strips, in addition to the plurality of metal strips and the dielectric material disposed in between the plurality of metal strips.

13. The PCB bridge of claim 1, wherein the PCB bridge interconnects more than two semiconductor chips in a 3D arrangement also, other than a 2D arrangement, in a single semiconductor module, wherein the plurality of the metal strips in the PCB bridge, in the 3D arrangement, includes a pair of metal strips, where the pair of metal strips is aligned one after the other, and each metal strip in the pair of the metal strips is stacked over another, and each metal strip in the pair of the metal strips has two legs or connectors to contact and connect with the semiconductor chips in the 3D arrangement; and wherein the 3D arrangement is a 3D stacking structure that includes the PCB bridge interconnecting at least four semiconductor chips, where two of the four semi-conductor chips are stacked on one another, and other two are stacked on one another, and wherein the stacked two semiconductor chips is then interconnected with the stacked other two semiconductor chips, via the stacked and aligned pairs of the metal strips in the in the PCB bridge in the vertical direction of the PCB bridge.

14. A 3D fanout crossing structure, constructed by interconnecting more than two semiconductor chips using at least two PCB bridges each claimed in claim 1, in a single semiconductor module, wherein the 3D fanout crossing structure is used to fanout a chip signal into three ways, wherein the at least two PCB bridges are stacked together to form a fanout crossing connection, the at least two PCB bridges interconnects at least four semiconductor chips, where at least two of the four semiconductor chips are facing opposite to each other, and other two are facing opposite to each other forming a fanout structure, and wherein the metal strips and/or the legs or connectors of one of the at least two PCB bridges connects with at least one of the four semiconductor chips via connection nodes, and wherein the at least two PCB bridges are in vertical direction to interconnect the at least four semiconductor chips.

15. A method of manufacturing a PCB bridge for interconnection of two or more semiconductor chips for data communication between the semiconductor chips, comprising:

fixing a PCB panel at one or more panel fixtures at corners of a PCB;

drawing laser cut lines to mark a plurality of metal strips for the PCB bridge, where each metal strip has two legs or connectors to contact and connect with connection pads on semiconductor chips, and wherein shape and size of the two legs or connectors of the each metal strip is drawn to be either same or different from each other to address semiconductor assembly issues including a step different issue and a tilting issue;

laser cutting out along the drawn laser cut lines to manufacture the plurality of metal strips for the PCB bridge;

aligning the cutout plurality of metal strips one after the other; and disposing a dielectric material in between the plurality of metal strips to manufacture the PCB bridge; and wherein, the PCB bridge is employed in a vertical direction in a semiconductor assembly for interconnection of two or more semiconductor chips, wherein the vertical direction of the PCB bridge provides a flexible impedance matching by adjusting the dielectric material and a trace width of the PCB bridge, and wherein the vertical direction of the PCB bridge avoids signal reflections by matching the impedance to a source, and wherein a trace length of the PCB bridge is limited by spacing in between two semiconductor chips which further limited inductance of the trace of the PCB bridge.

16. The method of claim 15, wherein the plurality of metal strips is made of copper, and the dielectric material is prepreg, and wherein the vertical arrangement of the PCB bridge provides unlimited trace width that further raises flexibility of the impedance matching.

17. The method of claim 16, wherein the PCB bridge is manufactured as a fully shielded strip line PCB bridge structure, wherein the fully shielded strip line PCB bridge structure further includes one or more metal deposition layers at a top and a bottom of fully shielded strip line PCB bridge structure in addition to the plurality of metal strips and the dielectric material disposed in between the plurality of metal strips; and wherein the fully shielded strip line PCB bridge structure forms electromagnetic field barriers as it is shielded by the top and bottom metal deposition layers and the inbetween filling of the dielectric material, the fully shielded strip line PCB bridge structure blocking noise interference from space.

18. The method of claim 16, wherein the PCB bridge is manufactured as a strip line PCB bridge structure with an external component on top, wherein the strip line PCB bridge structure with an external component on top further includes an external component on top of the PCB bridge in addition to the plurality of metal strips and the dielectric material disposed in between the plurality of metal strips, and wherein the external component is at least one of an inductor, a capacitor, a resistor or a ferrite bead.

19. The method of claim 16, wherein the PCB bridge is manufactured as a strip line fanout type PCB bridge structure, wherein the strip line fanout type PCB bridge structure further includes a conductive material in between the plurality of metal strips that connects each two metal strips of the plurality of metal strips in addition to the plurality of metal strips and the dielectric material disposed in between the plurality of metal strips; and wherein the strip line fanout type PCB bridge structure has two pitches, one pitch 'P' and the other is twice the pitch 'P'.

20. The method of claim 16, wherein the PCB bridge is manufactured as a strip line fanout type PCB bridge structure with embedded single layer capacitor, wherein the strip line fanout type PCB bridge structure with embedded single layer capacitor further includes a conductive material in between the plurality of metal strips that connects each two metal strips of the plurality of metal strips; and a single layer capacitor embedded in between two metal strips, in addition to the plurality of metal strips and the dielectric material disposed in between the plurality of metal strips; or wherein the PCB bridge is manufactured as a strip line fanout type PCB bridge structure with embedded multi-layer capacitor, as ground layer, wherein the strip line fanout type PCB bridge structure with embedded multi-layer capacitor further includes a conductive material that connects all of the plurality of the metal strips together at their end, in addition to the plurality of metal strips and the dielectric material disposed in between the plurality of metal strips; or wherein the PCB bridge is manufactured as a strip line fanout type PCB bridge structure with embedded multi-layer capacitor, as signal layer, wherein the strip line fanout type PCB bridge structure with embedded multi-layer capacitor further includes a conductive material that connects alternate metal strips at their end in the plurality of the metal strips, in addition to the plurality of metal strips and the dielectric material disposed in between the plurality of metal strips.

* * * * *